(12) United States Patent
Kondo et al.

(10) Patent No.: US 11,516,953 B2
(45) Date of Patent: Nov. 29, 2022

(54) CONTROL SYSTEM OF TAPE FEEDER FOR COMPONENT SUPPLY FROM REEL

(71) Applicant: FUJI CORPORATION, Chiryu (JP)

(72) Inventors: Toshiaki Kondo, Obu (JP); Kazuhiro Asada, Tokai (JP)

(73) Assignee: FUJI CORPORATION, Chiryu (JP)

( * ) Notice: Subject to any disclaimer, the term of this patent is extended or adjusted under 35 U.S.C. 154(b) by 370 days.

(21) Appl. No.: 16/637,921

(22) PCT Filed: Aug. 25, 2017

(86) PCT No.: PCT/JP2017/030454
§ 371 (c)(1),
(2) Date: Feb. 10, 2020

(87) PCT Pub. No.: WO2019/038899
PCT Pub. Date: Feb. 28, 2019

(65) Prior Publication Data
US 2020/0221619 A1 Jul. 9, 2020

(51) Int. Cl.
*H05K 13/08* (2006.01)
*H05K 13/04* (2006.01)
*G05B 13/02* (2006.01)

(52) U.S. Cl.
CPC ....... *H05K 13/0882* (2018.08); *G05B 13/024* (2013.01); *H05K 13/0419* (2018.08)

(58) Field of Classification Search
USPC ....................................................... 700/275
See application file for complete search history.

(56) References Cited

U.S. PATENT DOCUMENTS

| 5,808,824 A | * | 9/1998 | Kaniwa | G11B 15/46 360/73.14 |
| 8,157,142 B2 | * | 4/2012 | Tsukagoshi | H05K 13/0812 226/76 |
| 8,405,338 B2 | * | 3/2013 | Leppa | H02P 27/04 318/434 |

(Continued)

FOREIGN PATENT DOCUMENTS

| JP | 2003-124688 A | 4/2003 |
| WO | WO 2016/170644 A1 | 10/2016 |

OTHER PUBLICATIONS

International Search Report dated Nov. 28, 2017 in PCT/JP2017/030454 filed Aug. 25, 2017, 1 page.

*Primary Examiner* — Md Azad
(74) *Attorney, Agent, or Firm* — Oblon, McClelland, Maier & Neustadt, L.L.P.

(57) ABSTRACT

A control system of a tape feeder that includes a reel on which is wound component supply tape, and a tape feeding device configured to draw out the component supply tape from the reel to a component pickup position, the control system including a sensor configured to detect information relating to a remaining amount of the tape on the reel; and a motor control section configured to change an operation parameter of a motor that is a drive source of the tape feeding device based on the tape remaining amount information detected by the sensor. Specifically, the motor control section changes the operation parameter of the motor so as to reduce the motor torque as the tape remaining amount on the reel decreases, based on the tape remaining amount information detected by the sensor.

10 Claims, 6 Drawing Sheets

(56) References Cited

U.S. PATENT DOCUMENTS

| | | | | |
|---|---|---|---|---|
| 2010/0256819 A1* | 10/2010 | Song | ................ | H05K 13/0419 |
| | | | | 700/275 |
| 2013/0028701 A1* | 1/2013 | Sumi | ................ | H05K 13/0215 |
| | | | | 414/806 |
| 2014/0277680 A1* | 9/2014 | Youngquist | .......... | B23K 26/361 |
| | | | | 700/121 |
| 2016/0198597 A1* | 7/2016 | Matsumori | ........ | H05K 13/0419 |
| | | | | 221/9 |
| 2016/0205820 A1* | 7/2016 | Ohashi | ............... | H05K 13/0419 |
| | | | | 29/739 |

* cited by examiner

CONTROL SYSTEM OF TAPE FEEDER FOR COMPONENT SUPPLY FROM REEL

TECHNICAL FIELD

The present specification discloses technology relating to a control system of a tape feeder for drawing a component supply tape from a reel on which a component supply tape is wound and pitch feeding the component supply tape to a component pickup position.

BACKGROUND ART

Generally, a tape feeder includes a reel on which a component supply tape, in which components are packaged by being arranged at a predetermined pitch, is wound, and a tape feeding device that draws out the component supply tape from the reel and feeds the leading component of the component supply tape to a component pickup position where the leading component is picked up by a suction nozzle of the component mounter.

Further, in a tape feeder described in patent literature 1 (JP-A-2003-124688), the rotation speed and the rotation amount of the motor serving as the drive source of the tape supply device are changed in accordance with the type of the component supply tape used (the type of the component), and the tape feeding speed and the pitch feeding amount are changed in accordance with the type of the component supply tape.

CITATION LIST

Patent Literature

Patent Literature 1: JP-A-2003-124688

BRIEF SUMMARY OF INVENTION

Technical Problem

The force (load of motor) required for a tape feeding device to draw the component supply tape from the reel decreases as the remaining quantity of tape on the reel (component remaining quantity) decreases. Therefore, as the motor of the tape feeding device, a motor is used that generates the torque required to stably pitch feed the component supply tape even when the tape remaining quantity of the reel is large and the load is large.

However, with this configuration, even when the remaining amount of tape of the reel is small and the load of the motor is decreased, the motor is operated under the same conditions as when the remaining amount of tape of the reel was large, meaning that the reel is operated with a torque larger than required, as the remaining amount of tape of the reel is small, thereby wastefully consuming power.

Regarding this point, if a motor with a small torque margin above what is required is used to reduce power consumption, depending on the type of component supply tape used, the tape feeding rate may become slow due to insufficient torque of the motor when the remaining tape level of the reel is large, or the motor may become out of step such that the component supply tape cannot be stably fed.

With the above-mentioned patent literature 1, there is a function for changing the rotation velocity and the rotation amount (pitch-feed amount) of the motor in accordance with the type (type of component) of the component supply tape to be used, but there is no function of optimizing the control of the motor in accordance with the remaining amount of tape on the reel.

Solution to Problem

To solve the above problems, disclosed herein is a control system of a tape feeder that includes a reel on which is wound component supply tape in which components are packaged by being arranged in a line, and a tape feeding device configured to draw out the component supply tape from the reel and pitch feed the component supply tape such that a leading component in the component supply tape is moved to a component pickup position to be picked up by a suction nozzle of a component mounter, the control system including: a tape remaining amount information acquiring section configured to acquire tape remaining amount information that is information relating to a remaining amount of the tape on the reel; and a motor control section configured to change an operation parameter of a motor that is a drive source of the tape feeding device based on the tape remaining amount information acquired by the tape remaining amount information acquiring section.

With this configuration, based on tape remaining amount information acquired by the tape remaining amount acquiring section, for example, it is possible to perform control to change, as an operation parameter of the motor (for example, a speed profile or a drive current of a pitch feeding operation), a torque of the motor so as to decrease continuously or in steps in accordance with a decrease in the load on the motor as the tape remaining amount on the reel decreases, enabling a reduction in the power consumption of the motor without losing stability in tape feeding operation, thus achieving both goals of motor energy saving and stable tape feeding operation.

Another embodiment may be configured with an auxiliary actuator configured to reinforce drive power to pitch feeding operation of the component supply tape by the tape feeding device; a tape remaining amount information acquiring section configured to acquire tape remaining amount information that is information relating to a remaining amount of the tape on the reel; and an auxiliary actuator control section configured to change an operation parameter of the auxiliary actuator based on the tape remaining amount information acquired by the tape remaining amount information acquiring section.

With this configuration, since the auxiliary actuator for reinforcing the drive power to pitch feeding operation of the component supply tape by the tape feeding device is provided, it is sufficient to use a motor whose torque is smaller by an amount corresponding to the output of the auxiliary actuator as the motor of the tape feeding device. As a result, as well as reinforcing the insufficient drive power required for the pitch feeding operation of the component supply tape by the output of the auxiliary actuator, based on the tape remaining amount information acquired by the tape remaining amount information acquiring section, for example, it is possible to perform control to change, as an operation parameter of the motor, an output of the auxiliary actuator so as to decrease continuously or in steps in accordance with a decrease in the tape remaining amount on the reel, thus achieving both goals of motor energy saving and stable tape feeding operation.

DESCRIPTION OF EMBODIMENTS

A first and a second embodiment are described below.

First Embodiment

A first embodiment will be described with reference to FIGS. 1 to 4.

Figure 1:
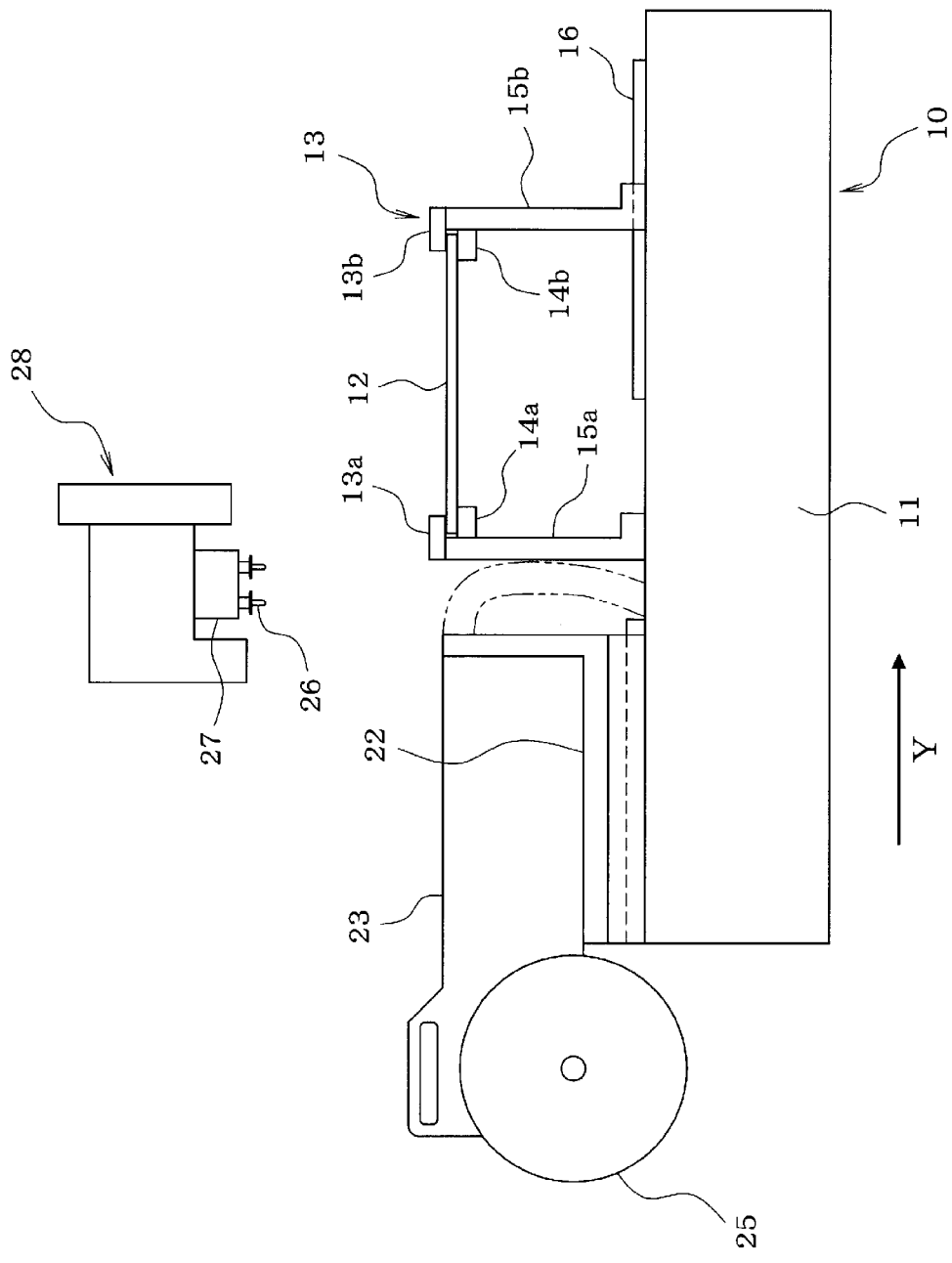
FIG. 1 is a side view showing the configuration of a component mounter according to a first embodiment.

First, the configuration of component mounter 10 will be described with reference to FIG. 1.

At least one component mounter 10 is installed in a component mounting line for producing a component-mounted board. Conveyor 13 that conveys circuit board 12 is provided on base 11 of component mounter 10 (below, the conveyance direction of circuit board 12 by conveyor 13 is referred to as the X direction, and the direction perpendicular to that is referred to as the Y direction). Of support members 15a and 15b that support the two conveyor rails 13a and 13b and conveyor belts 14a and 14b that configure conveyor 13, support member 15a is fixed at a specified position, with the support member 15b on the opposite side being adjusted in the Y direction along guide rail 16 by a screw mechanism (not shown) or the like such that the width of conveyor 13 (the gap between conveyor rails 13a and 13b) is adjustable to the width of circuit board 12.

Also, feeder setting table 22 is provided to the side of conveyor 13 on base 11, with multiple tape feeders 23 being removably set on feeder setting table 22 in the Y direction. Set on each tape feeder 23 is component supply tape 24 (see FIG. 2) on which is wound component supply tape housing many components at a fixed pitch, with the component supply tape 24 being set such that the leading component of the component supply tape pulled from the component supply tape 24 is positioned at a component pickup position (position at which the component is picked up by suction nozzle 26). Component mounter 10 is provided with head moving device 28 for moving mounting head 27 that holds suction nozzle 26 in the following order: component pickup position→component imaging position→component mounting position, and during component pickup operation and component mounting operation, suction nozzle 26 is raised and lowered.

Figure 2:
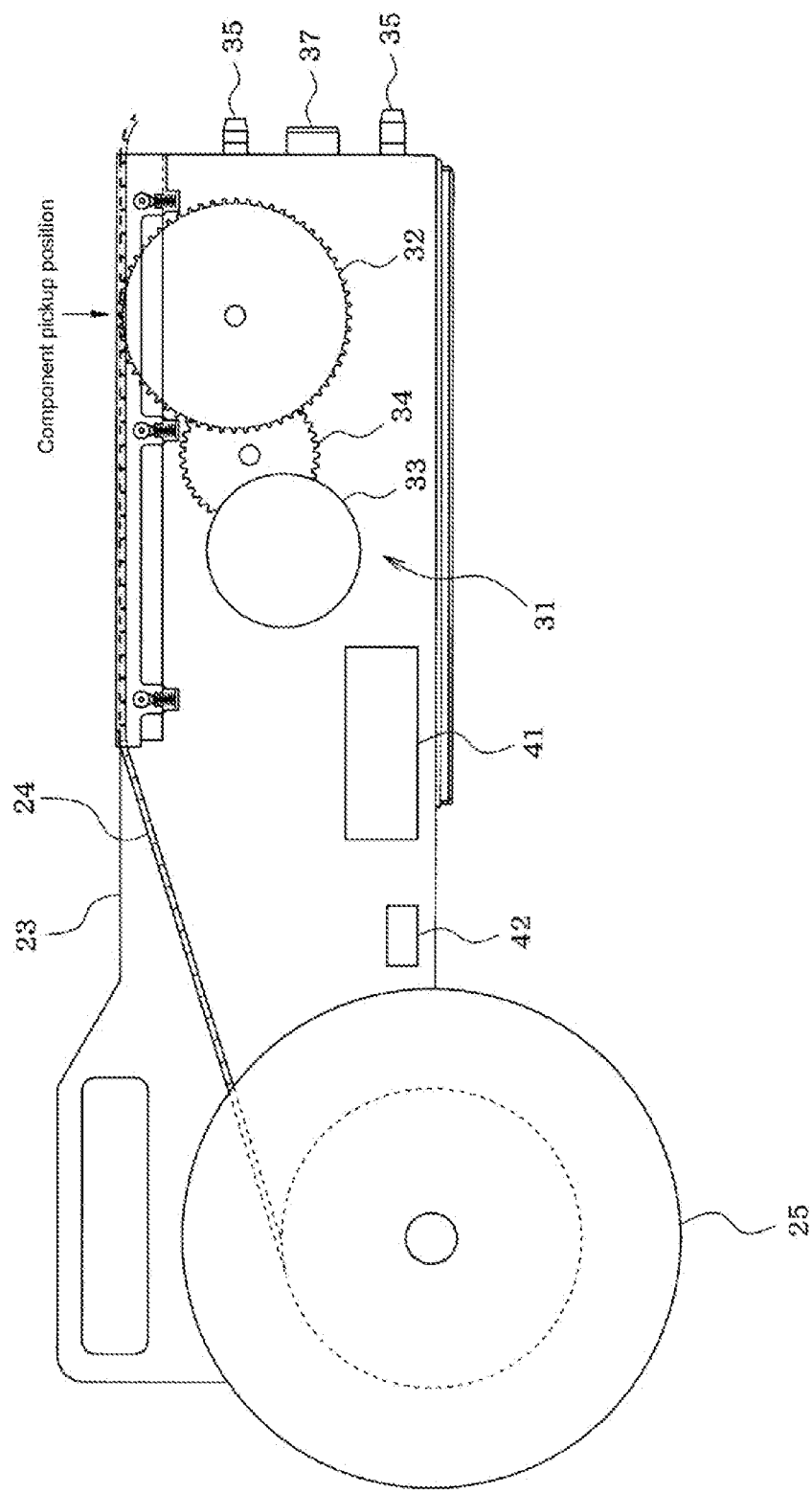
FIG. 2 is a side view showing the configuration of the tape feeder of the first embodiment.
Figure 3:
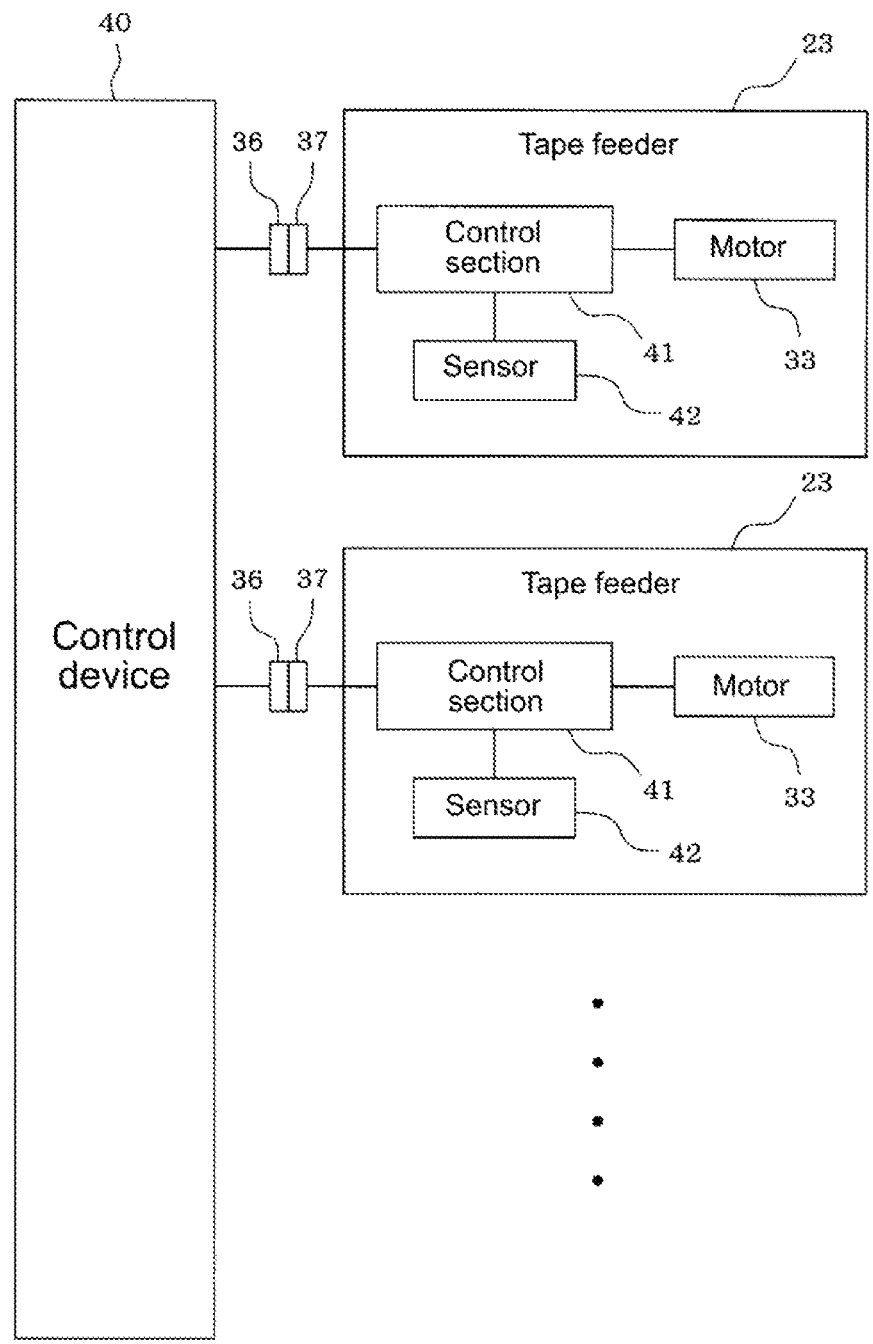
FIG. 3 is a block diagram showing a configuration of a control system of the tape feeder according to the first embodiment.
Figure 4:
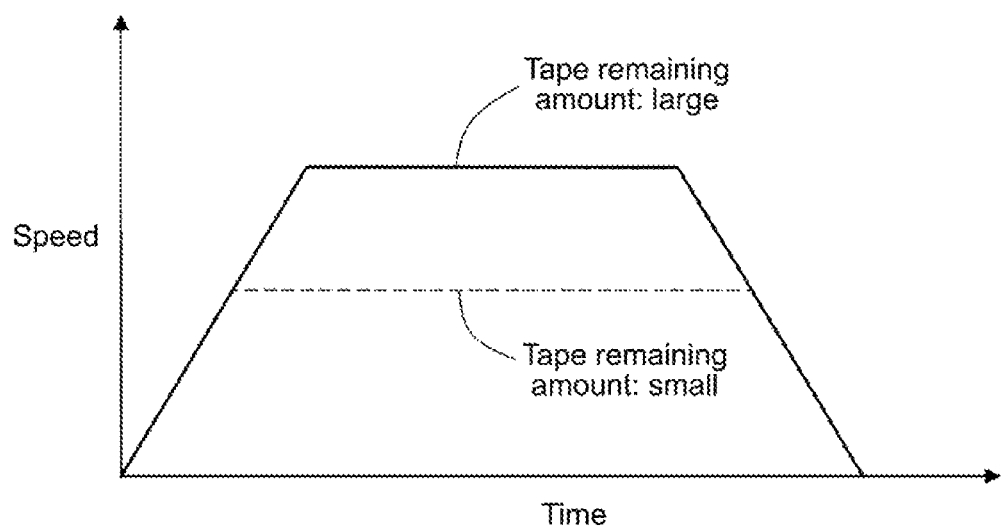
FIG. 4 shows an example of changing a speed profile of the pitch feeding operation in accordance with the tape remaining amount of the reel.

As shown in FIG. 2, tape feeder 23 is provided with tape feeding device 31 that draws out component supply tape 24 from reel 25 and pitch feeds it. Tape feeding device 31 is configured including: sprocket 32 that rotates to pitch feed with teeth engaged with feeding holes formed at equal pitches on one edge of tape feeder 23; motor 33 that serves as a drive source; and gear mechanism 34 that transmits the rotational force of motor 33 to sprocket 32 so as to rotate sprocket 32. For motor 33, a motor, for example, a stepping motor, a servo motor, or the like, capable of controlling the rotation angle (rotation position) is used to perform the pitch feeding operation of component supply tape 24.

Provided on the back end surface of tape feeder 23 are two positioning pins 35 for determining the mounting position with respect to component mounter 10, and connector 37 for both communication and power supply, which is connected to connector 36 (see FIG. 3) on the component mounter 10 side. Power is supplied from component mounter 10 to tape feeder 23 by connecting connectors 36 and 37, and control section 41 (motor control section) of tape feeder 23 and control device 40 of component mounter 10 are connected so as to be able to communicate with each other. Control section 41 of tape feeder 23 controls the operation of motor 33 of tape feeding device 31 based on a pitch feed command transmitted from control device 40 of component mounter 10 to control the pitch feeding operation of component supply tape 24.

Further, tape feeder 23 is provided with sensor 42 (tape remaining amount data acquiring section) for detecting the tape remaining amount of reel 25. Sensor 42 is configured using, for example, an ultrasonic sensor, an optical sensor, or the like, and detects the winding diameter of component supply tape 24 of reel 25 as the tape remaining amount information, and outputs the detected information to control section 41 of tape feeder 23.

Control section 41 of tape feeder 23 functions as a motor control section for changing an operation parameter of motor 33 of tape feeder 31 based on the tape remaining amount information detected by sensor 42. In the first embodiment, control section 41 of tape feeder 23 changes the operation parameter of tape feeder 33 so as to continuously or in steps decrease the torque of motor 33 as the tape remaining amount of reel 25 decreases and the load of motor 33 decreases, based on the tape remaining amount information detected by sensor 42. Here, the operation parameter of motor 33 to be changed based on the tape remaining amount information is, for example, the speed profile of the pitch feeding operation (see FIG. 4), and the maximum speed of the speed profile is continuously or in steps decreased as the tape remaining amount of reel 25 decreases.

Accordingly, as the tape remaining amount of reel 25 decreases and the load of motor 33 decreases, the torque of motor 33 and thus the power consumption can be controlled to be continuously or in steps reduced, and the power consumption of motor 33 can be reduced without impairing the stability of the tape feeding operation, thus achieving both goals of motor 33 energy saving and stable tape feeding operation.

Note that, operation parameter of motor 33 to be changed based on the tape remaining amount information is not limited to the speed profile of the pitch feeding operation, and for example, considering that the drive current of motor 33 and the torque are proportional to each other, control section 41 of tape feeder 23 may be configured to control the drive current of motor 33 to be continuously or in steps reduced as the tape remaining amount of reel 25 decreases. In this case too, as the tape remaining amount of reel 25 decreases, the torque of motor 33, and thus the consumed power, can be controlled so as to be continuously or in steps reduced, thus achieving both goals of motor 33 energy saving and stable tape feeding operation.

Second Embodiment

Figure 5:
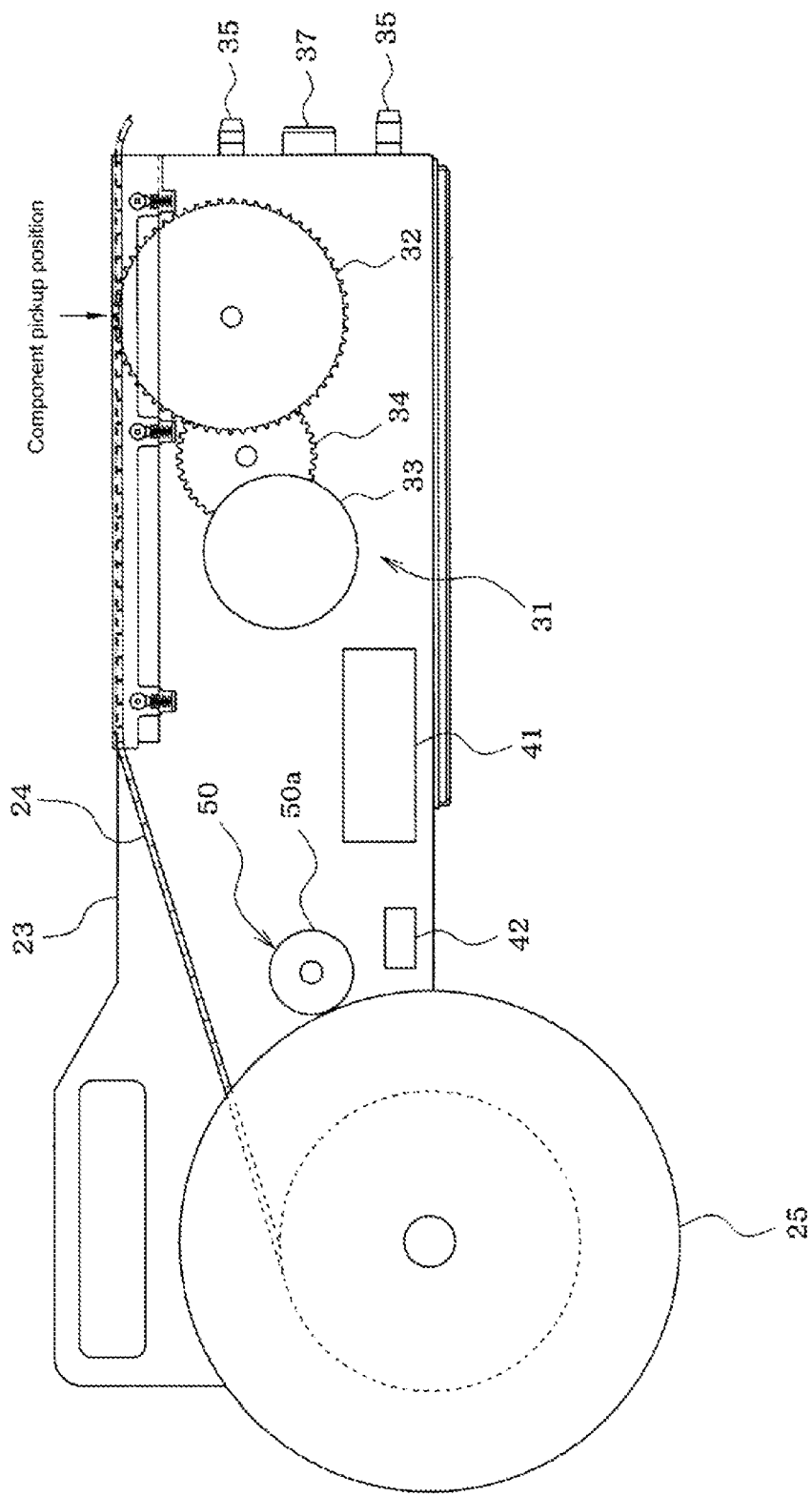
FIG. 5 is a side view showing the configuration of a tape feeder according to a second embodiment.
Figure 6:
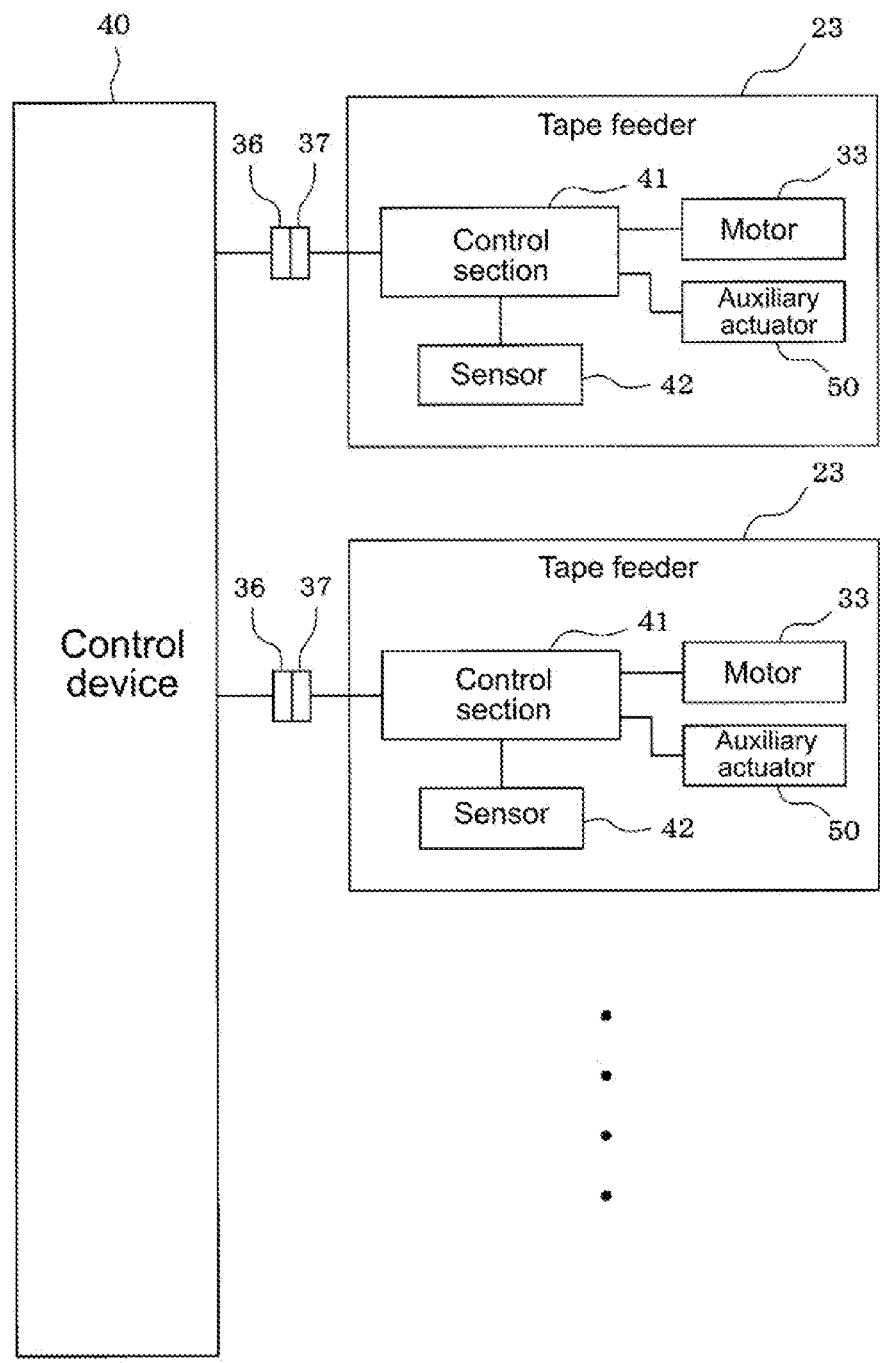
FIG. 6 is a block diagram showing the configuration of the control system of the tape feeder according to the second embodiment.

Next, a second embodiment will be described with reference to FIGS. 5 and 6. However, for sections which are practically the same as the first embodiment, explanations are omitted or abbreviated, with descriptions largely given for sections which are different.

Tape feeder 23 of the second embodiment is provided with auxiliary actuator 50 for reinforcing the drive power of the pitch feeding operation of component supply tape 24 by tape feeding device 31. Auxiliary actuator 50 is provided to transmit a rotational force in the pitch feeding direction to reel 25 in synchronization with the pitch feeding operation of component supply tape 24 by tape feeding device 31.

In the second embodiment, auxiliary actuator 50 is configured from, for example, an outer rotor type motor, and the outer peripheral surface of the auxiliary actuator 50a contacts the outer peripheral edge of reel 25 so as to apply a rotational force in the pitch feeding direction to reel 25. Note that, a high friction elastic member such as rubber having a relatively large friction coefficient may be provided on the outer peripheral surface of rotor 50a, and the high friction elastic member may contact the outer peripheral edge of reel 25 to prevent slippage between rotor 50a and reel 25.

In this case, control section 41 of tape feeder 23 functions as a motor control section for controlling the operation of motor 33 of tape feeding device 31, and also functions as an auxiliary actuator control section for changing the operation parameter of auxiliary actuator 50 based on the tape remaining amount information detected by sensor 42.

In the second embodiment, control section 41 of tape feeder 23 changes the operation parameter of the auxiliary actuator 50 so as to continuously or in steps decrease the output of auxiliary actuator 50 as the tape remaining amount of reel 25 decreases and the load of motor 33 decreases, based on the tape remaining amount information detected by sensor 42. In this case, the operation parameter of auxiliary actuator 50 to be changed based on the tape remaining amount information is, for example, a speed profile, a drive current, or the like.

Since tape feeder 23 of the second embodiment is provided with auxiliary actuator 50 for reinforcing the drive power to pitch feeding operation of the component supply tape by tape feeding device 31, it is sufficient to use a motor whose torque is smaller by an amount corresponding to the output the auxiliary actuator 50 as motor 33 of tape feeding device 31. As a result, as well as reinforcing the insufficient drive power required for the pitch feeding operation of component supply tape 24 by the output of the auxiliary actuator 50, based on the tape remaining amount information acquired by sensor 42, for example, it is possible to perform control to change, as an operation parameter of auxiliary actuator 50, an output of auxiliary actuator 50 so as to decrease continuously or in steps in accordance with a decrease in the tape remaining amount on reel 25. This makes it possible to achieve both power saving and stable tape feeding operation.

Note that, the configuration to rotate reel 25 by auxiliary actuator 50 may be changed as appropriate, and for example, the rotational force of the auxiliary actuator may be transmitted to reel 25 via a rotational transmission mechanism such as a gear mechanism or a belt transmission mechanism. Alternatively, a device (a roller, a sprocket, or the like) for applying a tensile force to component supply tape 24 drawn out from reel 25 may be driven by an auxiliary actuator, in other words, an auxiliary actuator for reinforcing the drive power of the pitch feeding operation of component supply tape 24 by tape feeding device 31 may be provided.

Other Embodiments

In the first and second embodiments above, the configuration is such that sensor 42 for detecting the tape remaining amount of reel 25 is provided as the tape remaining amount information acquiring section, but sensor 42 may be omitted, and control section 41 of tape feeder 23 may function as the tape remaining amount information acquiring section, and may calculate the rotation amount of motor 33 or the feeding amount of component supply tape 24 from the first pitch feeding operation of component supply tape 24, and function as the tape feeding information acquiring section that uses the calculated value as the tape feeding information, with control section 41 of tape feeder 23 calculating the tape remaining amount information based on the tape feeding information.

Alternatively, control device 40 of component mounter 10 may manage a component remaining quantity of tape feeder 23 by counting components picked up by suction nozzle 26 from tape feeder 23, and control device 41 (tape remaining amount information acquiring section) of tape feeder 23 may acquire the component remaining quantity of tape feeder 23 from control device 40 of component mounter 10 as the tape remaining amount information.

In addition, the present disclosure is not limited to these embodiments, and it goes without saying that the present disclosure can be implemented by various modifications within a range that does not deviate from the gist of the present disclosure, such as, for example, the configuration of tape feeder 23, the configuration of tape feeding device 31, and the like may be appropriately changed.

REFERENCE SIGNS LIST

10: component mounting machine;
22: feeder setting table;
23: tape feeder;
24: component supply tape;
25: reel;
26: suction nozzle;
27: mounting head;
28: head moving device;
31: tape feeding device;
32: sprocket;
33: motor;
40: control device of component mounter;
41: control section of tape feeder (motor control section, auxiliary actuator control section);
42: sensor (tape remaining amount data acquiring section);
50: auxiliary actuator

The invention claimed is:

1. A control system of a tape feeder that includes a reel on which is wound component supply tape in which components are packaged by being arranged in a line, and a tape feeding device configured to draw out the component supply tape from the reel and pitch feed the component supply tape such that a leading component in the component supply tape is moved to a component pickup position to be picked up by a suction nozzle of a component mounter, the control system comprising:
    a tape remaining amount information acquiring section configured to acquire a winding diameter of the component supply tape to obtain a tape remaining amount information that is information relating to a remaining amount of the tape on the reel; and
    a motor control section configured to change an operation parameter of a motor that is a drive source of the tape feeding device based on the tape remaining amount information acquired by the tape remaining amount information acquiring section, the motor control section configured to reduce the operation parameter of the motor to reduce a load of the motor as the remaining amount of the tape decreases.

2. The control system of the tape feeder according to claim 1, wherein
the motor control section is configured to change, as the operation parameter of the motor, a torque of the motor to be lower in accordance with the tape remaining amount of the reel decreasing, based on the tape remaining amount information acquired by the tape remaining amount information acquiring section.

3. The control system of the tape feeder according to claim 1, wherein
the motor control section is configured to change, as the operation parameter of the motor, a speed profile of pitch feeding operation, based on the tape remaining amount information acquired by the tape remaining amount information acquiring section.

4. The tape feeder control system according to claim 1, wherein
the motor control section is configured to change, as the operation parameter of the motor, a drive current, based on the tape remaining amount information acquired by the tape remaining amount information acquiring section.

5. A control system of a tape feeder that includes a reel on which is wound component supply tape in which components are packaged by being arranged in a line, and a tape feeding device configured to draw out the component supply tape from the reel and pitch feed the component supply tape such that a leading component in the component supply tape is moved to a component pickup position to be picked up by a suction nozzle of a component mounter, the control system comprising:
an auxiliary actuator configured to reinforce drive power to pitch feeding operation of the component supply tape by the tape feeding device;
a tape remaining amount information acquiring section configured to acquire a winding diameter of the component supply tape of the reel to obtain a tape remaining amount information that is information relating to a remaining amount of the tape on the reel; and
an auxiliary actuator control section configured to change an operation parameter of the auxiliary actuator based on the tape remaining amount information acquired by the tape remaining amount information acquiring section, the auxiliary actuator control section configured to reduce the operation parameter of the auxiliary actuator to decrease an output of the auxiliary actuator as the remaining amount of the tape decreases.

6. The control system of the tape feeder according to claim 5, wherein
the auxiliary actuator is configured to transmit rotation force in a pitch feeding direction to the reel in synchronization with pitch feeding operation of the component supply tape by the tape feeding device.

7. The control system of the tape feeder according to claim 5, wherein
the auxiliary actuator control section is configured to change, as an operation parameter of the auxiliary actuator, an output of the auxiliary actuator to be lower in accordance with the tape remaining amount on the reel decreasing based on the tape remaining amount information acquired by the tape remaining amount information acquiring section.

8. The control system of the tape feeder according to claim 1, wherein
the tape feeder is provided with, as the tape remaining amount information acquiring section, a sensor configured to detect the tape remaining amount of the reel.

9. The control system of the tape feeder according to claim 1, further comprising:
a tape feeding information acquiring section configured to calculate a rotation amount of the motor or a feeding amount of the component supply tape from a first pitch feeding operation of the component supply tape and take the calculated value as tape feeding information, wherein
the tape remaining amount information acquiring section is configured to calculate the tape remaining amount information based on the tape feeding information acquired by the tape feeding information acquiring section.

10. The control system of the tape feeder according to claim 1, wherein
a control device of the component mounter is configured to manage a component remaining quantity of the tape feeder based on a quantity of components picked up by the suction nozzle from the tape feeder, and acquire the component remaining quantity of the tape feeder from the control device of the component mounter as the tape remaining amount information.

* * * * *